US011602059B2

United States Patent
Knatt et al.

(10) Patent No.: US 11,602,059 B2
(45) Date of Patent: Mar. 7, 2023

(54) REFRIGERATION APPLIANCE WITH DETACHABLE ELECTRONICS MODULE

(71) Applicant: True Manufacturing Co., Inc., O'Fallon, MO (US)

(72) Inventors: Kevin Knatt, St. Louis, MO (US); Curt Cayemberg, Wentzville, MO (US)

(73) Assignee: TRUE MANUFACTURING CO., INC., O'Fallon, MO (US)

( * ) Notice: Subject to any disclaimer, the term of this patent is extended or adjusted under 35 U.S.C. 154(b) by 487 days.

(21) Appl. No.: 16/746,834

(22) Filed: Jan. 18, 2020

(65) Prior Publication Data
US 2021/0222939 A1    Jul. 22, 2021

(51) Int. Cl.
*H05K 5/00* (2006.01)
*H05K 5/02* (2006.01)
*G06F 1/16* (2006.01)
*F25C 5/20* (2018.01)

(52) U.S. Cl.
CPC ......... *H05K 5/0018* (2022.08); *H05K 5/0017* (2013.01); *H05K 5/0204* (2013.01); *F25C 5/24* (2018.01); *F25C 2600/04* (2013.01); *G06F 1/1654* (2013.01); *H05K 5/0247* (2013.01)

(58) Field of Classification Search
CPC ............... H05K 5/0017; H05K 5/0204; H05K 5/0247; H05K 5/0018; F25D 2400/361; F25D 2400/36; G06F 1/1654
See application file for complete search history.

(56) References Cited

U.S. PATENT DOCUMENTS

| 2,723,536 | A | 11/1955 | Mason |
| 3,171,266 | A | 3/1965 | Louis |
| 3,430,452 | A | 3/1969 | Dedricks et al. |
| 3,731,496 | A | 5/1973 | Frazier |
| 3,788,095 | A | 1/1974 | Grace et al. |
| 3,812,686 | A | 5/1974 | Tester |
| 3,913,349 | A | 10/1975 | Johnson |
| 5,479,707 | A | 1/1996 | Alvarez et al. |

(Continued)

FOREIGN PATENT DOCUMENTS

| DE | 102011082789 A1 | 3/2013 | |
| DE | 102011082789 A1 * | 3/2013 | ........... F25D 23/028 |

(Continued)

OTHER PUBLICATIONS

US 10,852,003 B2, 12/2020, Stroh (withdrawn)
Extended European Search Report, received from counterpart European Application No. 21151947.5-1009, 11 pages.

*Primary Examiner* — Nidhi Thaker
(74) *Attorney, Agent, or Firm* — Stinson LLP

(57) ABSTRACT

A refrigeration appliance has an enclosure that defines an electronics module recess and a detachable electronics module that can be releasably retained in the recess. Tabs and tab receivers can be integrated with the electronics module and enclosure to releasably retain the electronics module in the recess. A trim piece can releasably attach to a display bezel of the electronics module by a snap-fit connection to retain the electronics module in the electronics module recess. In use, the electronics module can be selectively removed and a data acquisition device can be connected to the appliance using a data connector that is exposed by removing the electronics module.

17 Claims, 12 Drawing Sheets

(56) References Cited

U.S. PATENT DOCUMENTS

| | | |
|---|---|---|
| 5,922,030 A | 7/1999 | Shank et al. |
| 6,058,732 A | 5/2000 | Kato et al. |
| 6,105,385 A | 8/2000 | Kato et al. |
| 6,109,055 A | 8/2000 | Kato et al. |
| 6,196,007 B1 | 3/2001 | Schlosser et al. |
| 6,209,340 B1 | 4/2001 | Lu |
| 6,257,009 B1 | 7/2001 | Tsuchikawa |
| 6,324,855 B1 | 12/2001 | Mullis |
| 6,418,736 B1 | 7/2002 | Cover |
| 6,453,696 B1 | 9/2002 | Kawasumi et al. |
| 6,463,746 B1 | 10/2002 | Bethuy et al. |
| 6,484,530 B1 | 11/2002 | Hobino et al. |
| 6,607,096 B2 | 8/2003 | Glass et al. |
| 6,612,126 B2 | 9/2003 | Kawasumi et al. |
| 6,637,227 B2 | 10/2003 | Stensrud et al. |
| 6,668,575 B2 | 12/2003 | Stensrud et al. |
| 6,681,580 B2 | 1/2004 | Shedivy et al. |
| 6,705,107 B2 | 3/2004 | Schlosser et al. |
| 6,761,036 B2 | 7/2004 | Teague et al. |
| 6,821,362 B2 | 11/2004 | Satou |
| 6,854,277 B2 | 2/2005 | Gist et al. |
| 6,880,358 B2 | 4/2005 | Lucas et al. |
| 6,907,744 B2 | 6/2005 | Miller et al. |
| 7,010,932 B2 | 3/2006 | Kuroyanagi et al. |
| 7,017,355 B2 | 3/2006 | Allison et al. |
| D526,338 S | 8/2006 | McDougal et al. |
| 7,168,262 B2 | 1/2007 | Hirano et al. |
| D537,457 S | 2/2007 | McDougal et al. |
| D540,830 S | 4/2007 | Gunshi |
| 7,197,889 B2 | 4/2007 | Wakatsuki et al. |
| 7,204,091 B2 | 4/2007 | Mlison et al. |
| 7,273,990 B2 | 9/2007 | Yoshida et al. |
| 7,281,386 B2 | 10/2007 | McDougal et al. |
| 7,284,391 B2 | 10/2007 | Miller et al. |
| 7,287,671 B2 | 10/2007 | Morrow, Sr. et al. |
| D557,716 S | 12/2007 | Okuda |
| 7,343,749 B2 | 3/2008 | Tsuchikawa et al. |
| 7,444,828 B2 | 11/2008 | Kadowaki et al. |
| 7,444,829 B2 | 11/2008 | Mori et al. |
| D597,107 S | 7/2009 | Ohtake |
| 7,686,127 B2 * | 3/2010 | LeClear ................ F25D 23/12 181/150 |
| 7,765,332 B2 * | 7/2010 | McCoy ................ H04L 67/56 710/2 |
| 7,779,641 B2 | 8/2010 | Lee et al. |
| 7,802,444 B2 | 9/2010 | Landers et al. |
| 7,832,219 B2 | 11/2010 | Baranowski et al. |
| 7,975,497 B2 | 7/2011 | Kaga et al. |
| 7,980,090 B2 | 7/2011 | Lanzani |
| 8,018,716 B2 * | 9/2011 | McCoy ................ F16M 11/08 345/169 |
| 8,042,344 B2 | 10/2011 | Morimoto et al. |
| D649,565 S | 11/2011 | LaFond et al. |
| 8,087,533 B2 | 1/2012 | Sellers |
| D653,682 S | 2/2012 | Herning et al. |
| 8,136,365 B2 | 3/2012 | Kaga et al. |
| 8,230,696 B2 | 7/2012 | Yamaguchi et al. |
| D668,272 S | 10/2012 | Ebelt et al. |
| D668,275 S | 10/2012 | LaFond et al. |
| D669,920 S | 10/2012 | LaFond et al. |
| D673,185 S | 12/2012 | LaFond et al. |
| 8,336,741 B2 | 12/2012 | Graviss et al. |
| 8,341,968 B2 | 1/2013 | Landers et al. |
| 8,375,738 B2 | 2/2013 | Kawasumi et al. |
| 8,387,826 B2 | 3/2013 | Tsubouchi et al. |
| 8,484,935 B2 | 7/2013 | LeBlanc et al. |
| 8,505,595 B2 | 8/2013 | Bragg et al. |
| 8,528,357 B2 | 9/2013 | Kondo et al. |
| 8,528,610 B2 * | 9/2013 | Kuehl ................ F25D 23/126 141/351 |
| D690,743 S | 10/2013 | Lafond et al. |
| D692,032 S | 10/2013 | LaFond et al. |
| 8,567,013 B2 | 10/2013 | Yamaoka et al. |
| 8,677,774 B2 | 3/2014 | Yamaguchi et al. |
| 8,677,777 B2 | 3/2014 | Yamaguchi et al. |
| D705,825 S | 5/2014 | Lafond et al. |
| 8,738,302 B2 | 5/2014 | Tirumala et al. |
| 8,763,851 B2 | 7/2014 | Jiang et al. |
| 8,844,312 B2 | 9/2014 | Yoshida et al. |
| 9,038,410 B2 | 5/2015 | Erbs et al. |
| D734,783 S | 6/2015 | Yong et al. |
| 9,052,130 B2 | 6/2015 | Schlosser |
| 9,061,881 B2 | 6/2015 | Brown et al. |
| D734,371 S | 7/2015 | Lei et al. |
| 9,097,450 B2 | 8/2015 | Kim et al. |
| 9,126,815 B2 | 9/2015 | Cooper et al. |
| 9,146,049 B2 | 9/2015 | Yamaguchi et al. |
| 9,151,528 B2 | 10/2015 | Erbs et al. |
| 9,188,378 B2 | 11/2015 | Maples |
| 9,217,597 B2 | 12/2015 | Mueller et al. |
| 9,243,833 B2 | 1/2016 | Yun et al. |
| 9,316,426 B2 | 4/2016 | Almblad |
| 9,346,659 B2 | 5/2016 | Brown |
| 9,351,571 B2 | 5/2016 | Myers et al. |
| 9,389,009 B2 | 7/2016 | Olson, Jr. et al. |
| 9,625,199 B2 | 4/2017 | Antoine et al. |
| 9,643,828 B2 | 5/2017 | Brown et al. |
| 9,803,907 B2 | 10/2017 | Erbs et al. |
| 9,933,195 B2 | 4/2018 | Roth et al. |
| 9,939,186 B2 | 4/2018 | Roth et al. |
| 10,001,306 B2 | 6/2018 | Litchy et al. |
| 10,059,580 B2 | 8/2018 | Wyatt et al. |
| 10,107,540 B2 | 10/2018 | Olson, Jr. et al. |
| 10,156,393 B2 | 12/2018 | Tarr et al. |
| 10,264,943 B2 | 4/2019 | Toga et al. |
| 10,266,383 B2 | 4/2019 | Haskayne |
| 10,274,239 B2 | 4/2019 | Kobayashi et al. |
| 10,300,161 B2 | 5/2019 | Erbs |
| 10,480,843 B2 | 11/2019 | Short et al. |
| 10,731,864 B2 | 8/2020 | Wild |
| 10,801,770 B2 | 10/2020 | Broadbent |
| 10,829,347 B2 | 11/2020 | Rudy et al. |
| 10,866,020 B2 | 12/2020 | Hoti et al. |
| 2005/0097912 A1 * | 5/2005 | Nam ................ F25D 29/005 62/331 |
| 2006/0261220 A1 * | 11/2006 | Lee ................ F16M 11/10 312/401 |
| 2008/0123284 A1 * | 5/2008 | Jaramillo ................ G06F 1/181 361/679.1 |
| 2009/0179040 A1 | 7/2009 | Hawkins |
| 2011/0085287 A1 * | 4/2011 | Ebrom ................ F24C 7/08 361/679.01 |
| 2014/0137593 A1 | 5/2014 | Broadbent |
| 2014/0137594 A1 | 5/2014 | Broadbent |
| 2014/0137984 A1 | 5/2014 | Broadbent |
| 2014/0144175 A1 | 5/2014 | Broadbent |
| 2014/0208781 A1 | 7/2014 | Broadbent |
| 2014/0208792 A1 | 7/2014 | Broadbent |
| 2014/0209125 A1 | 7/2014 | Broadbent |
| 2014/0216071 A1 | 8/2014 | Broadbent |
| 2015/0192338 A1 | 7/2015 | Knatt |
| 2015/0377538 A1 | 12/2015 | Rockwell |
| 2016/0007801 A1 | 1/2016 | Bressner et al. |
| 2016/0016133 A1 | 1/2016 | Merritt et al. |
| 2016/0045063 A1 | 2/2016 | Mantle et al. |
| 2016/0054043 A1 | 2/2016 | Broadbent |
| 2016/0054044 A1 | 2/2016 | Jeong et al. |
| 2016/0095450 A1 | 4/2016 | Trulaske, Sr. |
| 2016/0117022 A1 * | 4/2016 | Kim ................ H03K 17/9643 345/82 |
| 2016/0159520 A1 | 6/2016 | Vemula et al. |
| 2016/0178276 A1 * | 6/2016 | Park ................ G06F 3/0416 49/31 |
| 2016/0290697 A1 | 10/2016 | Broadbent et al. |
| 2016/0298893 A1 | 10/2016 | Knatt et al. |
| 2016/0327352 A1 | 11/2016 | Broadbent et al. |
| 2016/0334157 A1 | 11/2016 | Broadbent et al. |
| 2016/0370061 A1 | 12/2016 | Erbs |
| 2017/0003062 A1 | 1/2017 | Olson, Jr. et al. |
| 2017/0023284 A1 | 1/2017 | Broadbent |
| 2017/0067678 A1 | 3/2017 | Melton et al. |
| 2017/0176077 A1 | 6/2017 | Knatt |
| 2017/0183210 A1 | 6/2017 | Wyatt et al. |
| 2017/0370628 A1 | 12/2017 | Knatt |

(56) References Cited

U.S. PATENT DOCUMENTS

| | | |
|---|---|---|
| 2018/0003428 A1* | 1/2018 | Kwon ................... H05K 1/14 |
| 2018/0017304 A1 | 1/2018 | Knatt |
| 2018/0023847 A1 | 1/2018 | Kobayashi et al. |
| 2018/0023874 A1 | 1/2018 | Kobayashi et al. |
| 2018/0031294 A1 | 2/2018 | Olson, Jr. et al. |
| 2018/0106521 A1 | 4/2018 | Broadbent et al. |
| 2018/0142932 A1 | 5/2018 | Knatt et al. |
| 2018/0283760 A1 | 10/2018 | Knatt et al. |
| 2018/0313593 A1 | 11/2018 | Olvera et al. |
| 2019/0008004 A1 | 1/2019 | Wild |
| 2019/0383550 A1 | 12/2019 | Miedema |
| 2020/0400358 A1 | 12/2020 | Romagnoli |

FOREIGN PATENT DOCUMENTS

| | | | |
|---|---|---|---|
| EP | 3037757 A1 | 6/2016 | |
| EP | 3264014 A1 | 1/2018 | |
| EP | 3264014 A1 * | 1/2018 | ............... F25C 5/22 |
| GB | 1244831 | 9/1971 | |
| JP | H08285419 A | 11/1996 | |
| JP | 2006010181 A | 1/2006 | |
| JP | 2014044014 A | 3/2014 | |
| WO | 20150065564 A1 | 5/2015 | |
| WO | 20150171121 A1 | 11/2015 | |
| WO | 20160007738 A1 | 1/2016 | |
| WO | 20160011103 A1 | 1/2016 | |
| WO | 20160025845 A1 | 2/2016 | |
| WO | 20160057064 A1 | 4/2016 | |
| WO | 201600654866 A1 | 4/2016 | |
| WO | 20160089410 A1 | 6/2016 | |
| WO | 201600146082 A1 | 9/2016 | |
| WO | 20160181702 A1 | 11/2016 | |
| WO | 20160205685 A1 | 12/2016 | |
| WO | 20170004212 A1 | 1/2017 | |
| WO | 20170077295 A1 | 5/2017 | |
| WO | 20170083359 A1 | 5/2017 | |
| WO | 2017095691 A1 | 6/2017 | |
| WO | 2017102494 A1 | 6/2017 | |
| WO | 2017162680 A1 | 9/2017 | |
| WO | 2017180578 A1 | 10/2017 | |
| WO | 2017182214 A1 | 10/2017 | |
| WO | 2018007318 A1 | 1/2018 | |
| WO | 20180011711 A1 | 1/2018 | |
| WO | 20180022097 A1 | 2/2018 | |
| WO | 20180147843 A1 | 8/2018 | |
| WO | 20180148096 A1 | 8/2018 | |
| WO | 2018158186 A1 | 9/2018 | |
| WO | 2019143354 A1 | 7/2019 | |
| WO | 2019164480 A1 | 8/2019 | |

* cited by examiner

REFRIGERATION APPLIANCE WITH DETACHABLE ELECTRONICS MODULE

FIELD

The present disclosure pertains to a refrigeration appliance, such as an ice maker, a refrigerator, or a freezer, comprising a detachable electronics module.

BACKGROUND

Various refrigeration appliances are in extensive residential and commercial use. For example, refrigeration appliances, such as refrigerators, freezers and ice makers, use refrigeration devices to maintain the temperature of food in storage, form and hold ice, etc. Modern refrigeration appliances often include control systems that use signals from sensors to control various aspects of the appliance. Some modern refrigeration appliances include onboard control panels comprising a display and an input device for providing information to and receiving control inputs from a user. Certain refrigeration appliances include onboard memories that store information about the usage or performance of the appliances, such as historical data from the sensors.

SUMMARY

In one aspect, a refrigeration appliance comprises an enclosure configured to define an interior space of the appliance. The enclosure comprises an enclosure portion that defines an electronics module recess. A detachable electronics module comprises a display and a display housing enclosing at least a portion of the display. The electronics module is configured to be removably received in the electronics module recess. One of the enclosure portion and the display housing defines at least one tab and the other of the enclosure portion and the display housing defines a receiver for each tab. Each tab is removably insertable into the respective receiver to releasably couple the electronics module to the enclosure in the electronics module recess.

In another aspect, a refrigeration appliance comprises an enclosure configured to define at an interior space of the appliance. The enclosure comprises an enclosure portion that defines an electronics module recess. A detachable electronics module comprises a display and a display housing enclosing at least a portion of the display. The electronics module is configured to be removably received in the electronics module recess. A trim piece is configured to be releasably attached to the display housing by a snap-fit connection. The trim piece is configured to retain the electronics module in the electronics module recess when the electronics module is received in the electronics module recess and the frame is attached to the housing by the snap-fit connection.

In another aspect, a method of using a refrigeration appliance comprises removing a detachable electronics module from an electronics module recess defined in a portion of an enclosure of the appliance without loosening a threaded fastener. A data acquisition device is connected to the appliance using a data connector of the appliance that is exposed by said removing the electronics module from the enclosure. Information from the appliance is one of downloaded to the data acquisition device.

Other aspects will be in part apparent and in part pointed out hereinafter.

BRIEF DESCRIPTION OF THE DRAWINGS

Corresponding reference characters indicate corresponding parts throughout the drawings.

DETAILED DESCRIPTION

In general, aspects of this disclosure pertain to a refrigeration appliance that includes a detachable electronics module. In certain embodiments, a refrigeration appliance includes an electronics module that releasably attaches to an enclosure of a refrigeration appliance without threaded fasteners. In one or more embodiments, the electronics module can be selectively removed to, for example, replace the electronics module or another part of the refrigeration appliance; service the electronics module or another part of the refrigeration appliance; and/or connect a data acquisition device to a connector that is hidden by the electronics module to acquire information about the appliance such as usage data. In an exemplary embodiment described in further detail below, the refrigeration appliance comprises an ice maker. However, it is contemplated that one or more embodiments aspects of the detachable electronics module can be used in combination with other types of appliances (e.g., other types of kitchen appliances such as a cooking appliance, a food preparation or food processing appliance, etc.).

In this disclosure, the term "electronics module" refers to an assembly that includes one or more electronic components (e.g., a display, a memory, a processor, a controller, a speaker) that is at least partially contained in a housing. In one or more exemplary embodiments described in further detail below, the electronics module comprises a display that is enclosed in a housing comprising a bezel. It is contemplated that displays within the scope of the present disclosure include electroluminescent displays, liquid crystal displays, light-emitting diode displays, plasma displays, quantum dot displays, segment displays, and light indicator panels. Other types of displays can also be used in one or more embodiments.

Below, one embodiment of a refrigeration appliance comprising a detachable electronics module is described in which the refrigeration appliance comprises an ice maker. The ice maker enclosure receives a portion or all of (i) a refrigeration system including an ice formation device and (ii) a water system for supplying water to the ice formation device for being turned into ice. It will be understood that other types of refrigeration appliances within the scope of this disclosure will include a refrigeration system at least partially received in an enclosure but lack a water system. Still other types of appliances could include other types of appliance hardware in the enclosure in one or more embodiments, Before turning to the details of an exemplary embodiment of a detachable electronics module, the basic components and use of the illustrated ice maker are described.

Figure 1:
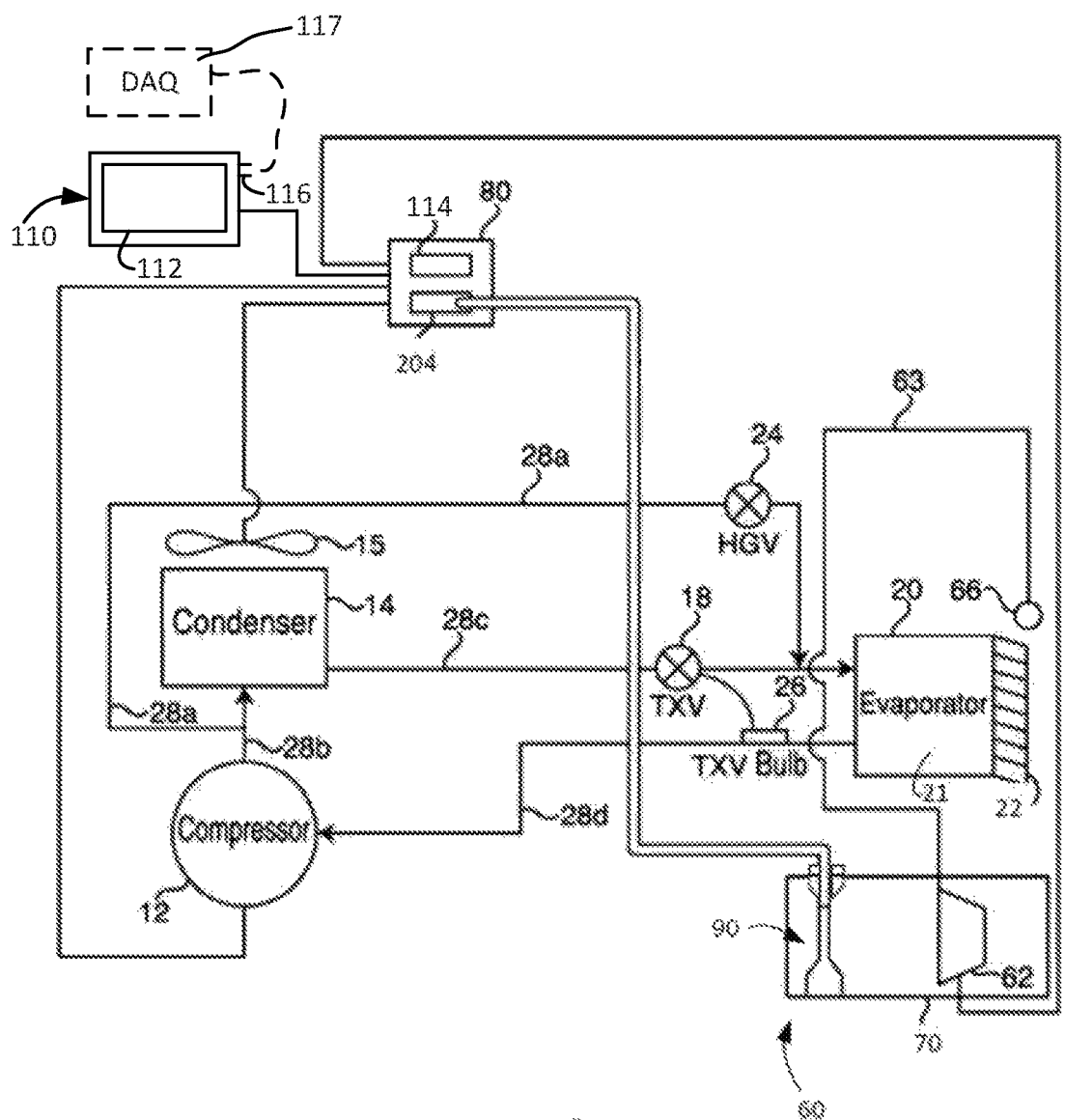
FIG. 1 is a schematic block diagram of an ice maker.

FIG. 1 illustrates certain principal components of one embodiment of an ice maker 10 having a refrigeration system and water system. The refrigeration system of the ice maker 10 includes a compressor 12, a heat rejecting heat exchanger 14, a refrigerant expansion device 18 for lowering the temperature and pressure of the refrigerant, an ice formation device 20, and a hot gas valve 24, As shown, it will be understood that the heat rejecting heat exchanger 14 may comprise a condenser for condensing compressed refrigerant vapor discharged from the compressor 12, However, in other embodiments, for example, in refrigeration systems that utilize carbon dioxide refrigerants where the heat of rejection is trans-critical, heat rejecting heat exchanger is able to reject heat from the refrigerant without condensing the refrigerant. The ice formation device 20 includes an evaporator 21 and a freeze plate 22 thermally coupled to the evaporator 21. The evaporator 21 is constructed of serpentine tubing (not shown) as is known in the art. In certain embodiments, the freeze plate 22 contains a large number of pockets (usually in the form of a grid of cells) on its surface where water flowing over the surface can collect. Hot gas valve 24 is used, in one or more embodiments, to direct warm refrigerant from the compressor 12 directly to the evaporator 21 to remove or harvest ice cubes from the freeze plate 22 when the ice has reached the desired thickness.

The refrigerant expansion device 18 can be of any suitable type, including a capillary tube, a thermostatic expansion valve or an electronic expansion valve. In certain embodiments, where the refrigerant expansion device 18 is a thermostatic expansion valve or an electronic expansion valve, the ice maker 10 may also include a temperature sensor 26 placed at the outlet of the evaporator 21 to control the refrigerant expansion device 18. In other embodiments, where the refrigerant expansion device 18 is an electronic expansion valve, the ice maker 10 may also include a pressure sensor (not shown) placed at the outlet of the evaporator 21 to control the refrigerant expansion device 18 as is known in the art. In certain embodiments that utilize a gaseous cooling medium (e.g., air) to provide condenser cooling, a condenser fan 15 may be positioned to blow the gaseous cooling medium across the condenser 14. A form of refrigerant cycles through these components via refrigerant lines 28a, 28b, 28c, 28d.

The water system of the illustrated ice maker 10 includes a sump assembly 60 that comprises a water reservoir or sump 70, a water pump 62, and a water level sensor 90. The water system of the ice maker 10 further includes a water supply line (not shown) and a water inlet valve (not shown) for filling sump 70 with water from a water source (not shown). In one or more embodiments, the water system of the ice maker 10 further includes a discharge line (not shown) and a discharge valve (not shown; e.g.; purge valve, drain valve) disposed thereon for draining water from the tank. The water system 14 further comprises a water line 63 and a water distributor 66 (e.g., manifold, pan; tube, etc.) that generally constitute passaging for fluidly connecting the sump 70 to the freeze plate 22. During operation of the ice maker 10, the pump 62 pumps water from the sump 70 through the water line 63 and out of the water distributor 66 onto the freeze plate 22. The distributor 66 distributes water onto the freeze plate 22 so that the water flows over the pockets of freeze plate and freezes into ice. The sump 70 may be positioned below the freeze plate 22 to catch the water coming off of the freeze plate such that the water may be recirculated by water pump 62. In one or more embodiments, the water distributor 66 comprises any of the water distributors described in U.S. Patent Application Publication No. 2014/0208792, which is incorporated herein by reference in its entirety.

The ice maker 10 may also include a controller 80. The controller 80 may be located remote from the ice making device 20 and the sump 70 or may comprise one or more onboard processors, in one or more embodiments. The controller 80 may include a processor 82 for controlling the operation of the ice maker 10 including the various components of the refrigeration system and the water system. The processor 82 of the controller 80 may include a non-transitory processor-readable medium storing code representing instructions to cause the processor to perform a process. The processor 82 may be, for example, a commercially available microprocessor, an application-specific integrated circuit (ASIC) or a combination of ASICs, which are designed to achieve one or more specific functions, or enable one or more specific devices or applications. In certain embodiments, the controller 80 may be an analog or digital circuit, or a combination of multiple circuits. The controller 80 may also include one or more memory components (not shown) for storing data in a form retrievable by the controller. The controller 80 can store data in or retrieve data from the one or more memory components.

In various embodiments, the controller 80 may also comprise input/output (I/O) components (not shown) to communicate with and/or control the various components of ice maker 10. In certain embodiments, for example, the controller 80 may receive inputs such as, for example, one or more indications, signals, messages, commands, data, and/or any other information, from the water level sensor 90, a harvest sensor for determining when ice has been harvested (not shown), an electrical power source (not shown), an ice level sensor (not shown), and/or a variety of sensors and/or switches including, but not limited to, pressure transducers, temperature sensors, acoustic sensors, etc. In various embodiments, based on those inputs for example, the controller 80 may be able to control the compressor 12, the condenser fan 15, the refrigerant expansion device 18, the hot gas valve 24, the water inlet valve, the discharge valve, and/or the water pump 62, for example, by sending, one or more indications, signals, messages, commands, data, and/or any other information to such components.

In the illustrated embodiment, the controller 80 is connected to an electronics module 110 that is configured to be detachably coupled to the ice maker 10. The illustrated electronics module 110 comprises a touch screen display 112 configured to display information to a user and receive user inputs for controlling the ice maker. In other embodiments, the electronics module could comprise another type of display and/or another type of user input device. The illustrated ice maker 10 further comprises a memory 114 in communication with the controller 80. The memory 114 is configured to store information about the ice maker. For example, in one or more embodiments, the memory 114 is configured to store usage information about the ice maker based on the indications, signals, messages, commands, data, and/or other information received by the controller 80. In one or more embodiments, the memory 114 stores firmware, display animations, unit information, control programs, etc. The ice maker 10 comprises a data connector 116 communicatively coupled to the memory 114. The data connector 116 is configured for connecting an external data acquisition device 117 (broadly, an external memory device or an external processing device) to the memory 114 to download the information from the memory. As will be explained in further detail below, ice maker 10 is configured so that, when the electronics module 110 is removed or detached from the remainder of the ice maker, the data connector 116 is exposed so that a user can connect the data acquisition device 117 to the data connector 116. The information stored on the memory 114 can thus be downloaded to the data acquisition device 117 to perform diagnostics or other functions.

In one or more embodiments, the data acquisition device 117 comprises a USB memory device. In an embodiment, the controller 80 is configured to determine whether the USB memory device stores a top level file and take a specified action depending on whether the USB memory device stores a top level file and depending on the file format of any top level file that is identified. For example, if the controller 80 determines that the USB memory device 117 has no top level file, the controller 80 is configured to automatically upload some or all of the information stored on the memory 114 onto the external memory device. In an embodiment, the information uploaded onto USB memory device 117 includes one or more of an ice maker model number, an ice maker serial number, a cycle history (e.g., stored measured times for completion of freeze and/or harvest cycles), an alarm history, a service history, conservation settings, parameters, and/or any and all data received from sensors associated with the ice maker 10. In an embodiment, the controller 80 tabulates the data that is uploaded on to the USB memory device 117 in a .CSV file. If the controller 80 determines that the USB memory device 117 has a top level file in a .BIN format, the controller automatically downloads the file and saves it to the memory 114 as new firmware. If the controller 80 determines that the USB memory device 116 has a top level file in a .GIF format, the controller will enable the user to replace a graphic display (e.g., a screensaver, advertisement) configured to be displayed via the electronics module 110. In certain embodiments, the user must navigate a memory to replace an existing (e.g., default) graphic display with the graphic display stored in the .GIF file; but in some embodiments, the controller 80 can automatically replace a graphic element that is currently stored in the memory 114 with the one stored in the USB memory device 117.

In one or more embodiments, an external processing device 117 can be coupled to the ice maker using the connector 116. For example, a USB-to-RS485 connector can connect an external computer to the ice maker 110 via the connector 116. Once connected, a user can modify software stored in the memory 114 via the external computer. For example, the external computer can execute manufacturer-specific software for modifying the control logic, display parameters, and/or other operating characteristics of the ice maker 110 that are stored in the memory 114.

Figure 2:
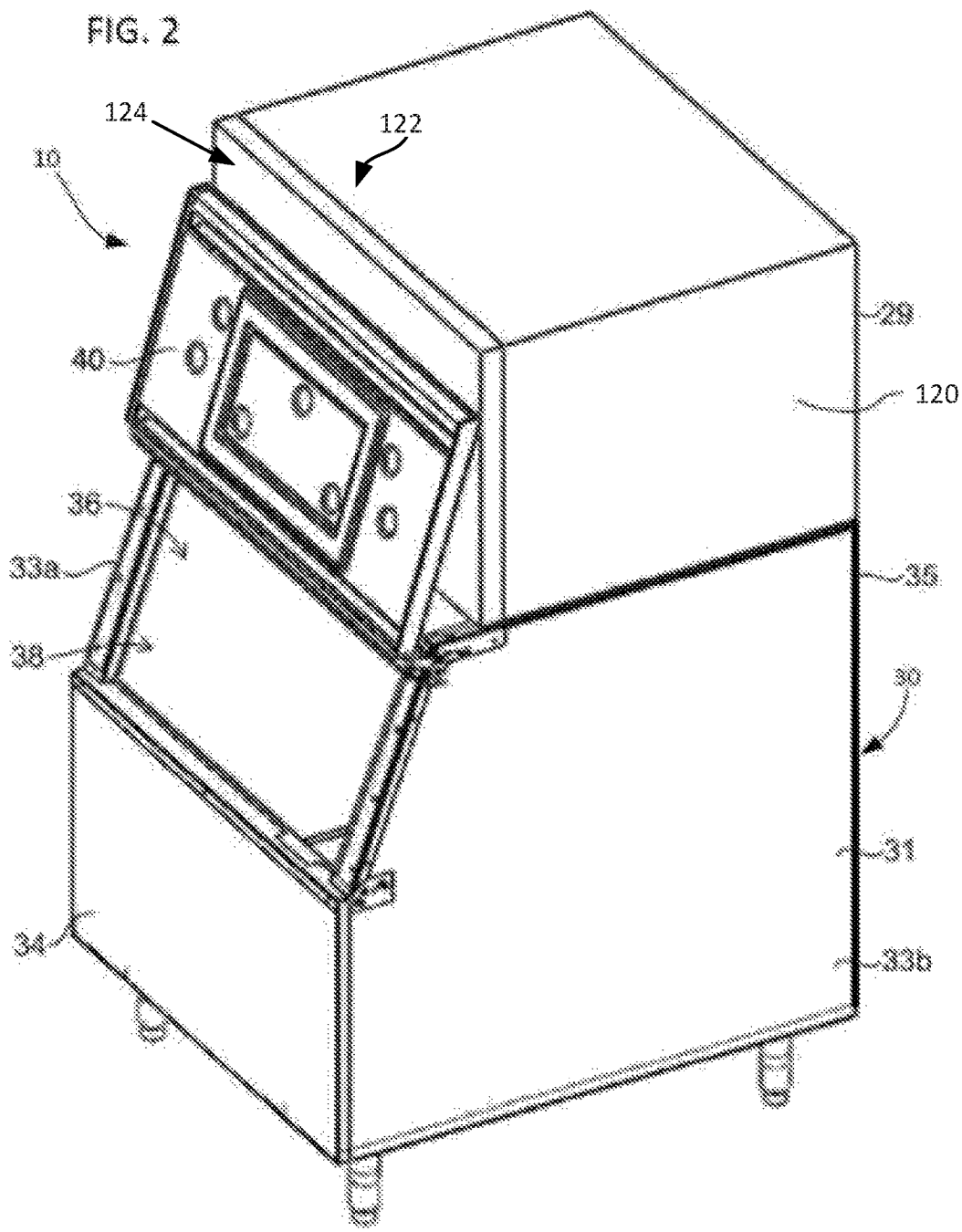
FIG. 2 is a perspective of an ice maker supported on a bin.

Referring to FIG. 2, one or more components of the ice maker 10 may be stored inside of an enclosure 29 of the ice maker 10 that defines an interior space. For example, portions or all of the refrigeration system and water system of the ice maker 10 described above can be received in the interior space of the enclosure 29. In the illustrated embodiment, the enclosure 29 is mounted on top of an ice storage bin assembly 30. The ice storage bin assembly 30 includes an ice storage bin 31 having a drop zone (not shown) through which ice produced by the ice maker 10 falls. The ice is then stored in a cavity 36 until retrieved. The ice storage bin 31 further includes an opening 38 which provides access to the cavity 36 and the ice stored therein. The cavity 36, drop zone (not shown), and opening 38 are formed by a left wall 33a, a right wall 33b, a front wall 34, a back wall 35 and a bottom wall (not shown). The walls of the ice storage bin 31 may be thermally insulated with various insulating materials including, but not limited to, fiberglass insulation or open- or closed-cell foam comprised, for example, of polystyrene or polyurethane, etc. in order to retard the melting of the ice stored in the ice storage bin 31. A door 40 can be opened to provide access to the cavity 36.

The illustrated enclosure 29 is comprised of a cabinet 120 (broadly, a stationary enclosure portion) and a door 124 (broadly, a movable or removable enclosure portion). In the illustrated embodiment, the door 124 is part of a door assembly 122 that also includes the electronics module 110, as will be described in further detail below. In FIG. 2, the door 40 of the ice storage bin assembly 30 is raised so that it partially obscures the door assembly 122, but an exemplary embodiment of the door assembly (including the electronics module 110) is shown more clearly in FIG. 3. The door assembly 122 is movable with respect to the cabinet 120 (e.g., on a hinge) to selectively provide access to the interior space of the ice maker 10. Thus, a technician may open the door assembly 122 to access the internal components of the ice maker 10 as required for repair or maintenance. In one or more other embodiments, the door assembly may be opened in other ways, such as by removing the door assembly from the cabinet 120.

Figure 3:
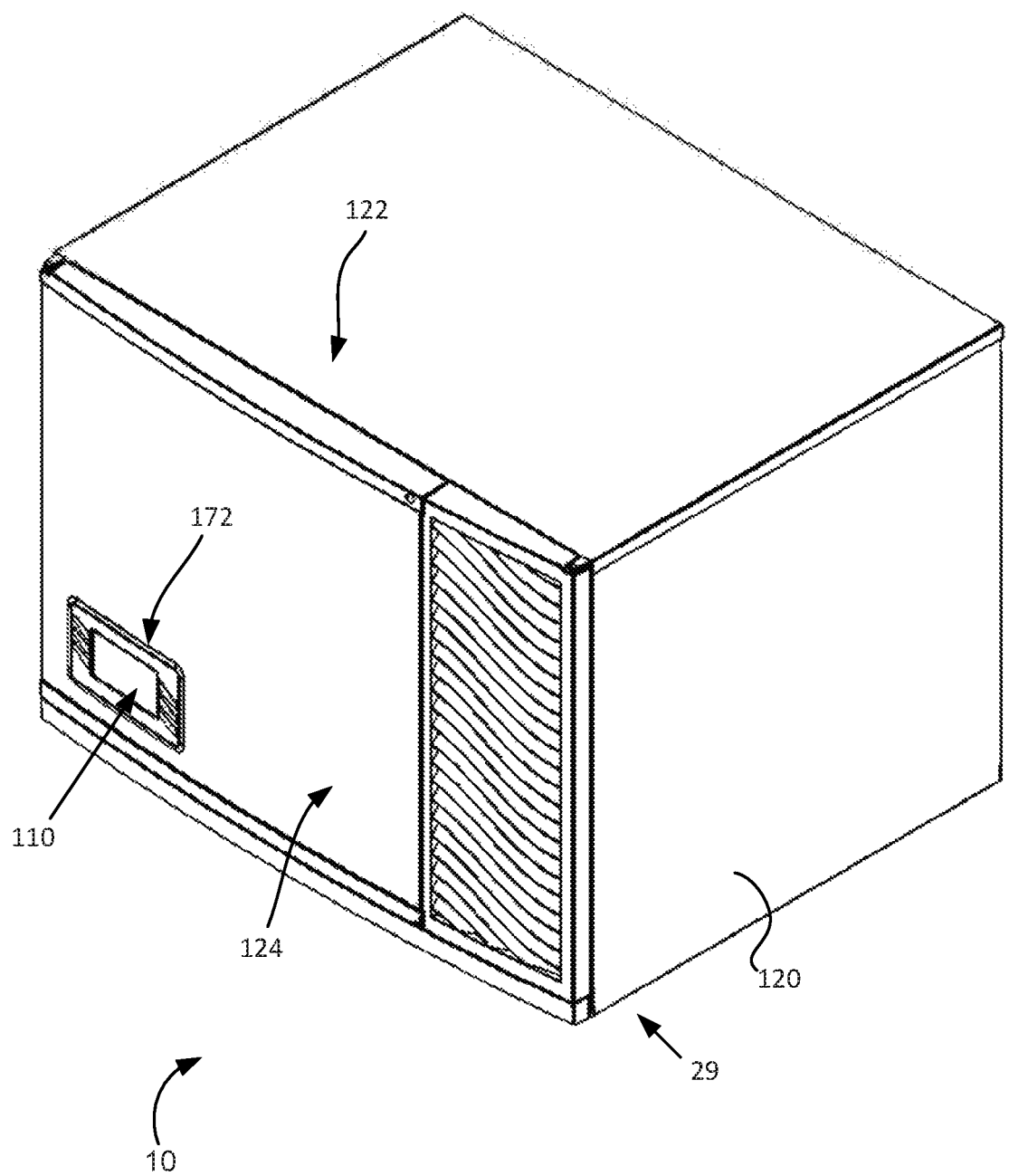
FIG. 3 is a perspective of the ice maker.
Figure 4:
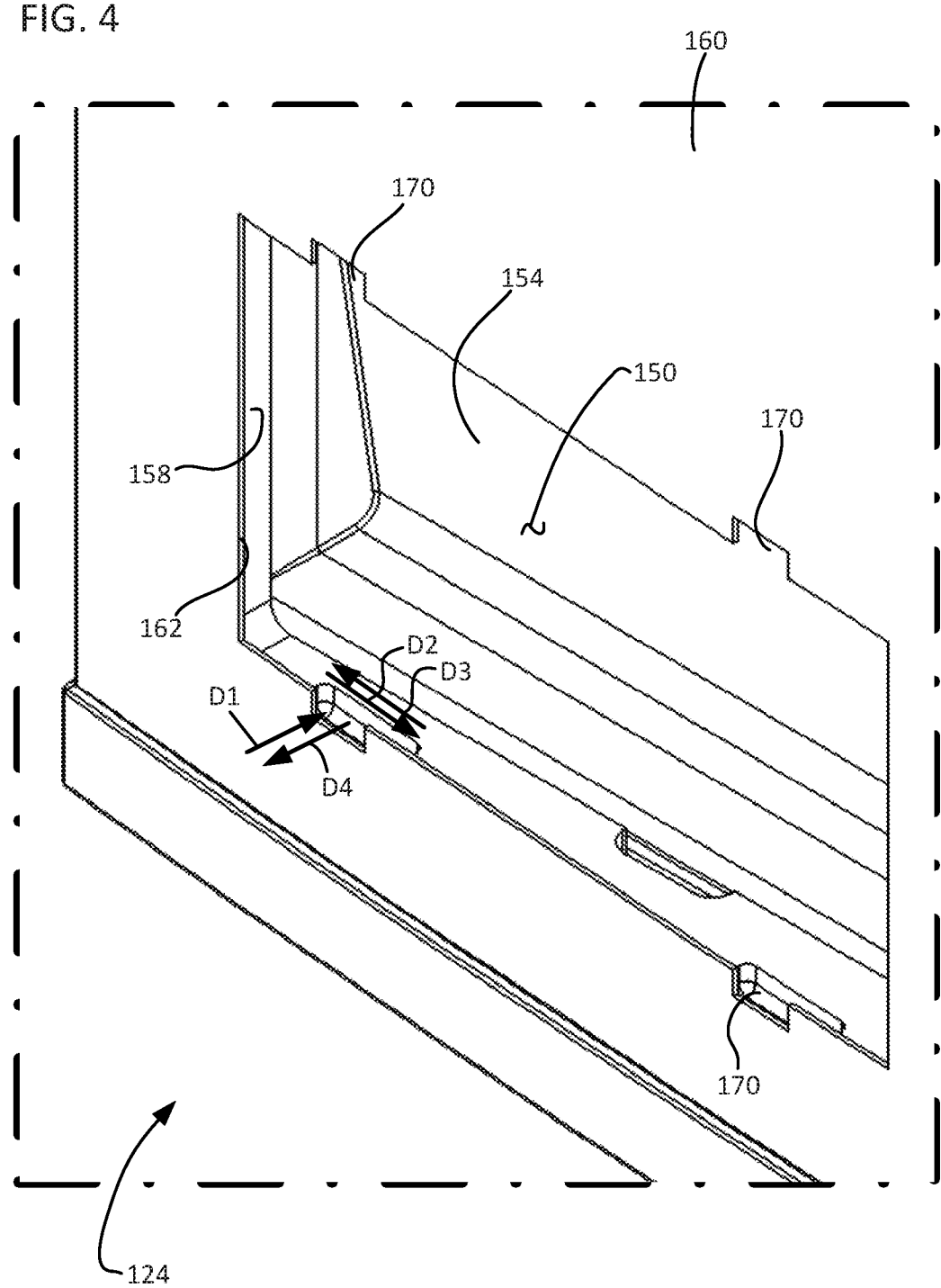
FIG. 4 is an enlarged perspective of a portion of a door of the ice maker.
Figure 5:
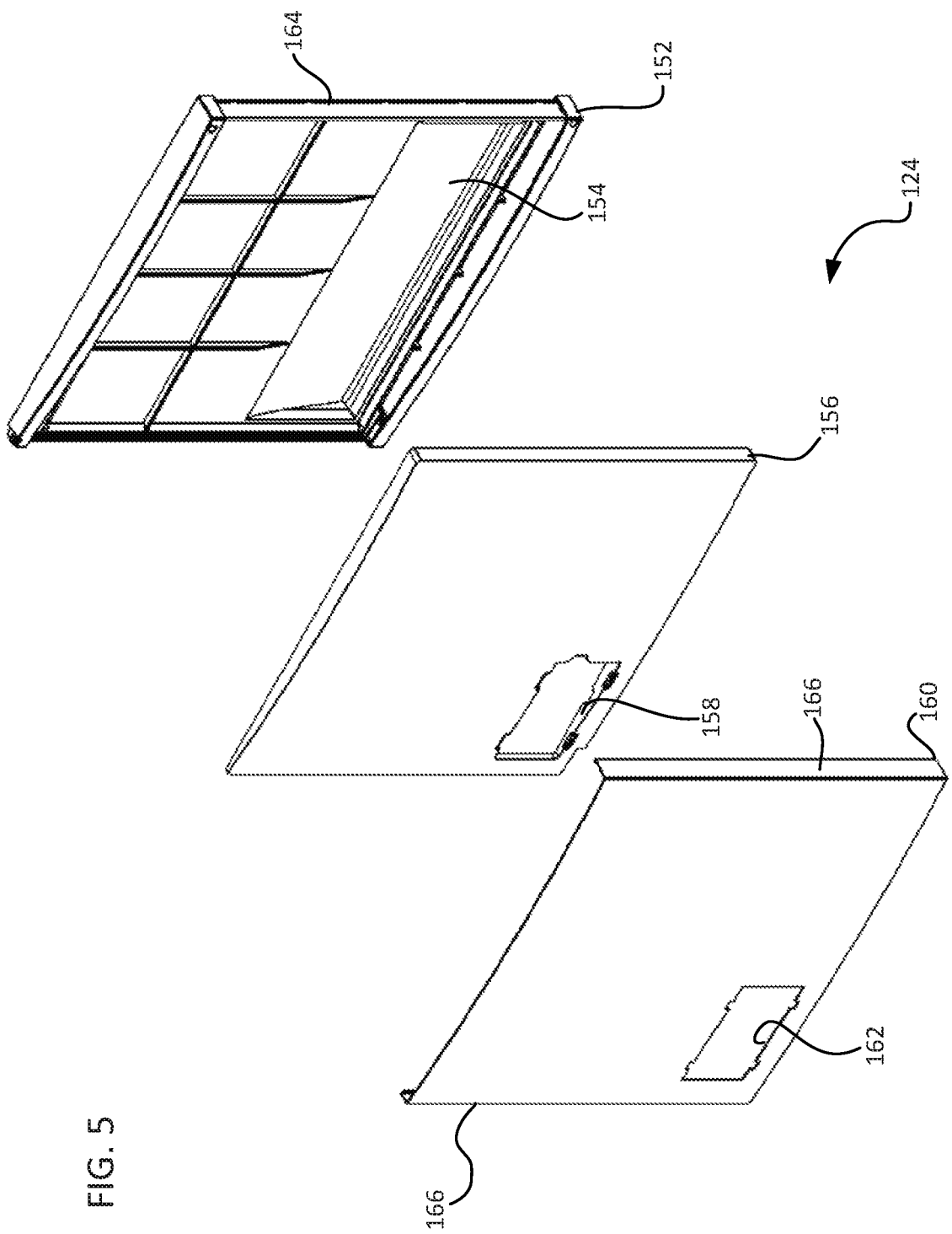
FIG. 5 is an exploded perspective of the ice maker door.

Referring to FIGS. 3-5, the detachable electronics module 110 is part of the door assembly 122 and configured to be releasably attached to the door 124. More specifically, the illustrated door 124 defines an electronics module recess 150, and the electronics module 110 is configured to be releasably retained in the electronics module recess to form the door assembly 122. As will be explained in further detail below, in one or more embodiments, the electronics module 110 is configured to be retained in the electronics module recess 150 without the use of any threaded fasteners connecting the electronics module to the enclosure 29. As will also be explained below, the door 124 and the electronics module 110 are configured to cover the data connector 116 when the electronics module is received in the electronics module recess 150 and expose the data connector when the electronics module is removed from the electronics module recess so that a user can connect the data acquisition device 117 to the ice maker 10. Although in the illustrated embodiment the electronics module recess 150 is formed in the door 124 of the enclosure 29 and the electronics module 110 is configured to be removably attached to the door, in certain embodiments, the electronics module recess is formed in another portion of the enclosure (e.g., a wall of the stationary cabinet) or the removable electronics module is otherwise configured to attach to another portion of the enclosure.

Referring to FIG. 5, the illustrated door 124 comprises a structural door panel 152 that is configured to be mounted on the cabinet 120 by a hinge 153. In one or more embodiments, the structural door panel 152 comprises a single piece of molded rigid plastic that is suitable for supporting the door assembly 122 as it swings on the hinge between an open and a closed position. The structural door panel can also have other configurations in certain embodiments. The structural door panel 152 includes a depression 154. In the illustrated embodiment, the depression 154 defines a rear portion of the electronics module recess 150, as shown in FIG. 4.

Referring again to FIG. 5, the illustrated door 124 further comprises an insulation panel 156 that is configured to extend across the front of the structural door panel 152 to insulate the door, and more broadly, to insulate the front portion of the enclosure 29. The insulation panel 156 can be formed from rigid foam or any other suitable insulating material. The insulation panel 156 includes an electronic module opening 158. When the insulation panel 156 is supported on the structural door panel 152 in use, the electronics module opening 158 is generally aligned with the depression 154 as shown in FIG. 4, Thus, in the illustrated embodiment, the electronics module opening 158 of the insulation panel 156 defines a middle portion of the electronics module recess 150.

Referring yet again to FIG. 5, the illustrated door 124 further comprises a veneer panel 160 that mounts on structural door panel 152 across the front of the door to provide an aesthetically pleasing appearance. In an exemplary embodiment, the veneer panel 154 is formed from a single piece of stainless steel, though other materials and configurations can be used in other embodiments. Like the insulation panel 156, the veneer panel 160 includes an electronics module opening 162. When the veneer panel 160 is mounted on the structural door panel 152 in use, the electronics module opening 162 is generally aligned with the depression 154 in the structural door panel 152 and the other electronics module opening 158 in the insulation panel 156 as shown in FIG. 4. Thus, in the illustrated embodiment, the electronics module opening 162 of the veneer panel 160 defines a front portion of the electronics module recess 150.

The veneer panel 160 can be attached to the structural door panel 152 in any suitable way. In an exemplary embodiment, the veneer panel 160 attaches to the structural door panel 152 without the use of separate fasteners. For example, referring to FIG. 5, in the illustrated embodiment, each of a pair of opposite side margins of the structural door panel 152 defines an elongate groove 164 (the groove along the right side of the door panel is shown in FIG. 5) and the veneer panel 160 has a pair of opposite side portions 166 that are generally configured to snap into the grooves to fix the veneer panel onto the door panel. The side portions 166 of the veneer panel 160 are generally U-shaped in cross-section. When the door 124 is assembled, the U-shaped side portions 166 extend from respective front corner regions of the structural door panel 152 around the corners and along the sides of the door panel, into the respective grooves 164. The veneer panel 160 is configured so that the veneer panel must be resiliently deformed slightly to fit the free cross-sectional end segment of both side portions 166 into the grooves 164. When the free cross-sectional end segments of both side portions 166 are received in the grooves 164, the veneer panel can rebound to hold itself in place on the structural door panel 152.

Referring to FIG. 4, the door 124 is configured so that the electronics module recess 150 includes a plurality of receivers 170 along the perimeter of the recess. As will be explained in further detail below, each receiver 170 is configured to receive a tab (broadly, a latching element) of the electronics module 110 therein to retain the electronics module in the electronics module recess. In the illustrated embodiment, the electronics module recess 150 includes two receivers 170 that are spaced apart along the bottom side of the recess and two receivers that are spaced apart along the top side of the recess. Thus, broadly speaking, an electronics module recess can include at least one receiver (e.g., a plurality of receivers) along each of a pair of opposite sides of the recess. Other embodiments of electronics module recesses can include other numbers and arrangements of receivers.

In general each receiver 170 comprises an L-shaped slot. In the illustrated embodiment, the receivers are generally L-shaped as viewed in plan. For example, the bottom receivers 170 are generally L-shaped when viewed in top plan, and the top receivers are generally L-shaped when viewed in bottom plan. In FIG. 4, only the bottom receivers 170 are shown in such a way as to illustrate the L-shaped slot, but it will be understood that the top receivers have the same configuration.

As can be seen most clearly in the bottom receivers 170 shown in FIG. 4, each receiver includes a first segment (e.g., the short segment of the L-shaped slot) that extends from a respective opening at the front of the door 124 rearward in a first direction D1. Each receiver 170, further includes a second segment that extends laterally from the rear end of the first segment in a second direction D2 (e.g., to the right in FIG. 4). In the illustrated embodiment, each L-shaped slot 170 is defined by a notch along the perimeter of the electronics module opening 162 of the veneer panel 160 and a groove formed along the perimeter of the electronics module opening 158 of the insulation panel 156, An L-shaped receiver slot can be formed in other ways in one or more embodiments. Further, the electronics module recess can include other types of structure (e.g., tabs) for retaining the electronics module therein in certain embodiments.

Figure 6:
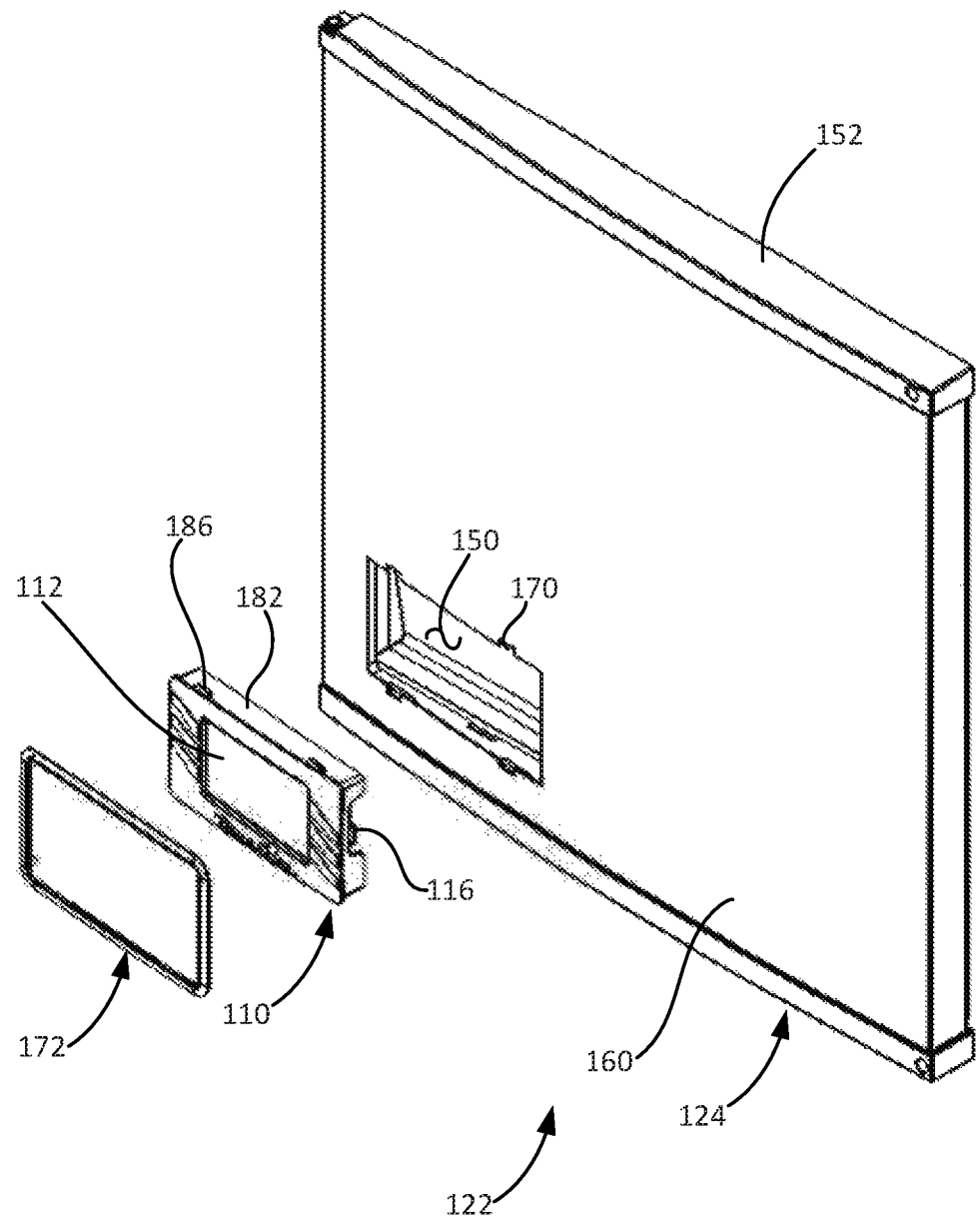
FIG. 6 is an exploded perspective of a door assembly including the ice maker door, an electronics module, and a trim piece.

Referring to FIG. 6, the door assembly 122 further includes a trim piece 172 that fits around the electronics module 110. As will be explained below, the electronics module 110 is configured to be removably received in the electronics module recess 150 and includes latching structure that interfaces with the receivers 170 to secure the electronics module in the electronics module recess 150 without any threaded fasteners. As will be further explained below, the trim piece 172 is configured to releasably attach to the electronics module 110 to retain the electronics module in the recess 150 such that the electronics module cannot be removed from the recess without first removing the trim piece from the electronics module.

Figure 7:
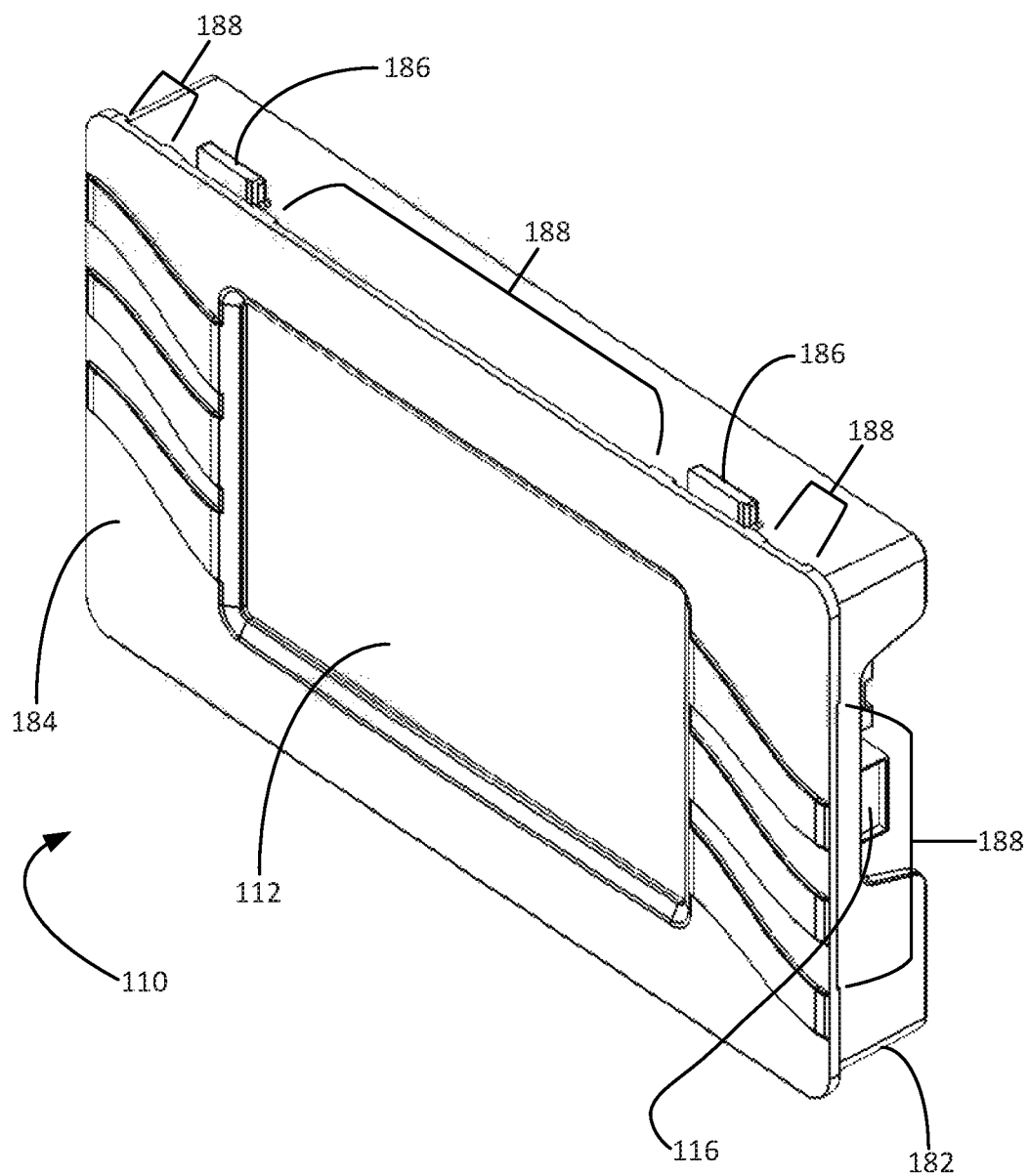
FIG. 7 is a perspective of the electronics module.
Figure 8:
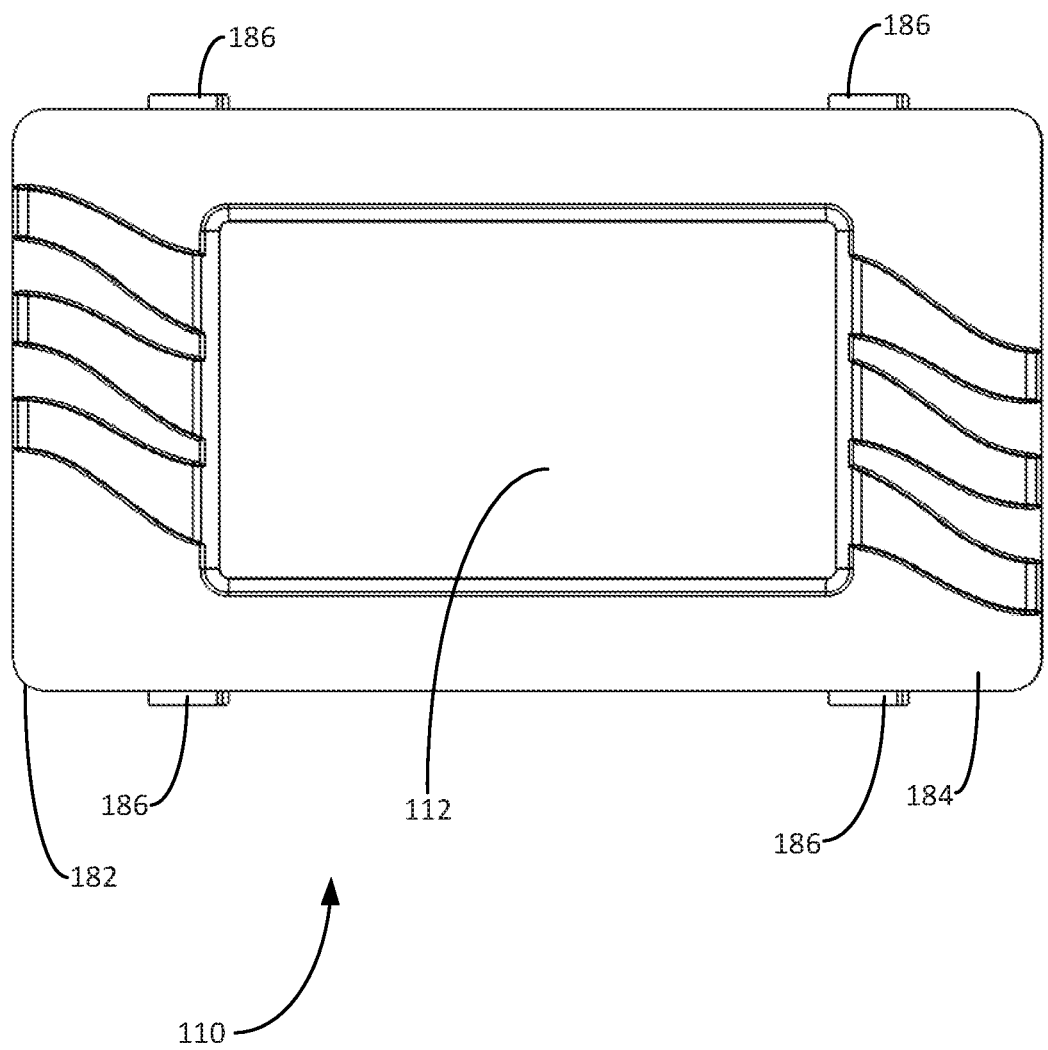
FIG. 8 is a front elevation of the electronics module.
Figure 9:
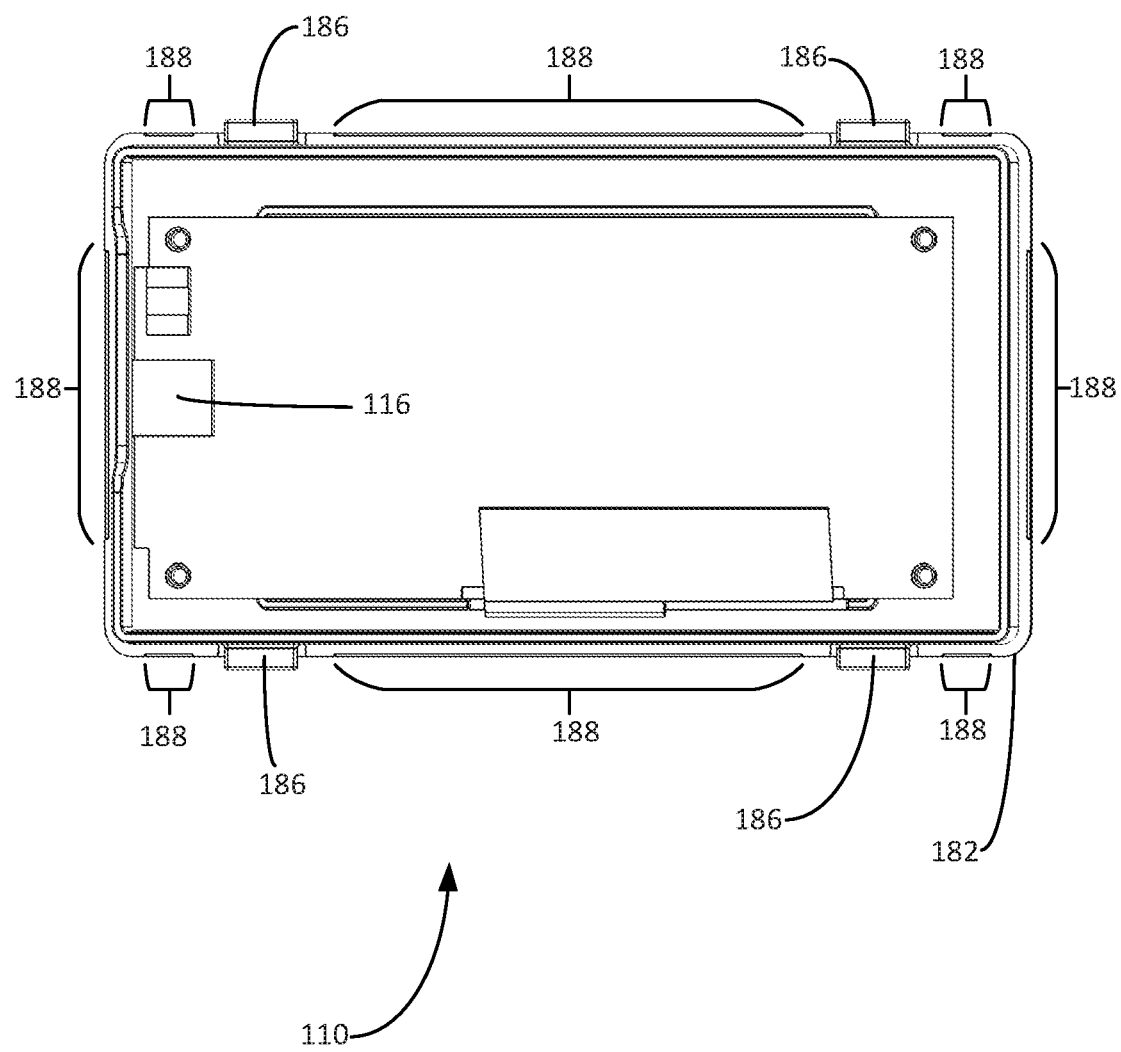
FIG. 9 is a rear elevation of the electronics module.

Referring to FIGS. 7-9, the illustrated electronics module comprises a touch-screen LCD display 112 and a display housing 182 enclosing at least a portion of the display. As explained above, other electronics modules can include other types of displays and/or user input devices in one or more embodiments. The illustrated display housing 182 comprises a decorative bezel 184 that includes a flange portion that is configured cover a portion of the perimeter of the electronics module recess 150 when the electronics module 110 is attached to the door 124. In the illustrated embodiment, the data connector 116 is integral to the electronics module 110 such that the data connector moves with the electronics module as it is attached to and removed from the door 124. For example, the illustrated data connector 116 is mounted directly on the rear portion of the electronics module 110 such that the data connector is covered when the electronics module is attached to the door and exposed when the electronics module is removed from the door. In one or more embodiments, a data connector can also be mounted on, or otherwise attached to, the enclosure in another way that results in removal of the electronics module exposing the data connector for being connected to a data acquisition device.

The display housing 182 further comprises a plurality of tabs 186 that are generally configured for being lockingly received in the receivers 170 when the electronics module 110 is received in the recess 150. Thus, in the illustrated embodiment, the electronics module 110 includes two tabs 186 that are spaced apart along the bottom side (broadly, a first side) of the display housing 182 and two tabs that are spaced apart along the top side (broadly, an opposite second side) of the display housing. The two pairs of upper and lower tabs 186 correspond to the two pairs of upper and lower receivers 170. Each illustrated tab 186 protrudes vertically from the respective one of the top and bottom walls of the display housing 182 and is dimensioned to slot into a respective receiver 170, as will be described in further detail below. Broadly speaking, an electronics module can include at least one tab (e.g., a plurality of tabs) along each of a pair of opposite sides of a display housing in one or more embodiments. Other embodiments of electronics modules can include other numbers and arrangements of tabs or other latching elements.

The bezel 184 of the display housing 182 has a decorative front side and an opposite rear side. Portions of the rear side of the bezel 184 are configured to contact the front of the veneer panel 160 of the door 124 (broadly, the front of the door or exterior surface portion of the enclosure 29) when the electronics module 110 is received in the recess 150. The rear side of the bezel 184 also defines a plurality of snap-fit grooves 188 that are configured to attach the trim piece 172 to the display housing 182 by a snap-fit connection, as will be described in further detail below.

Figure 10:
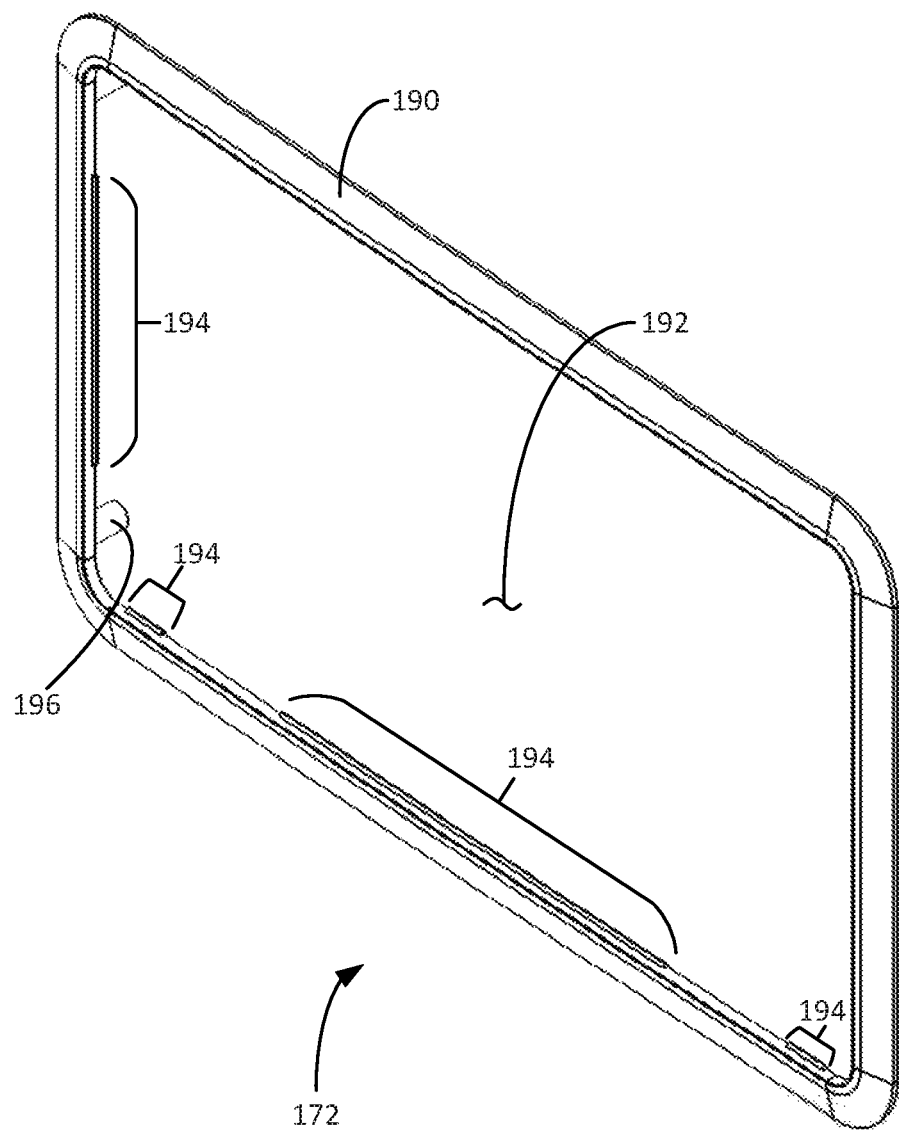
FIG. 10 is a perspective of the trim piece.
Figure 11:
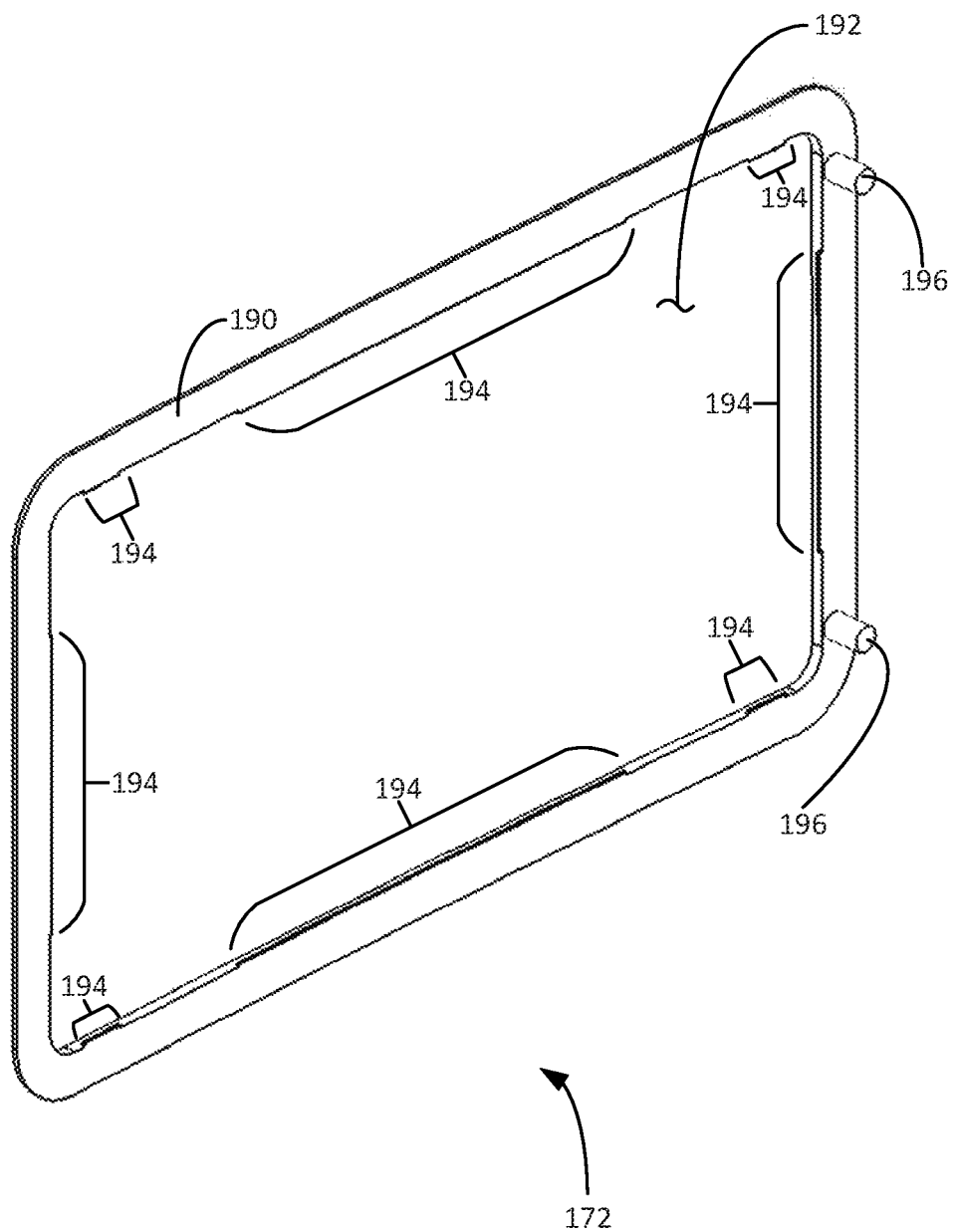
FIG. 11 is a rear perspective of the trim piece.

Referring to FIGS. 10-11, the illustrated trim piece comprises a frame 190 that defines an opening 192 for receiving the bezel 184 of the electronics module 110. The frame 190 is configured to be fitted onto the perimeter of the bezel 184 such that the trim piece 172 extends around and frames the electronics module 110 when the electronics module is attached to the door 124. The trim piece 172 is generally configured to be releasably attached to the display housing by a snap-fit connection. More specifically, the illustrated trim piece 170 comprises a plurality of snap-fit protrusions 194 along the inner perimeter of the frame 190 that are shaped and arranged to snap into the snap-fit grooves 188 of the bezel 184 when the frame is fitted to the bezel. The snap-fit connection formed by the groves 188 and the protrusions 194 is configured to releasably attach the trim piece onto the electronics module 110.

Figure 12:
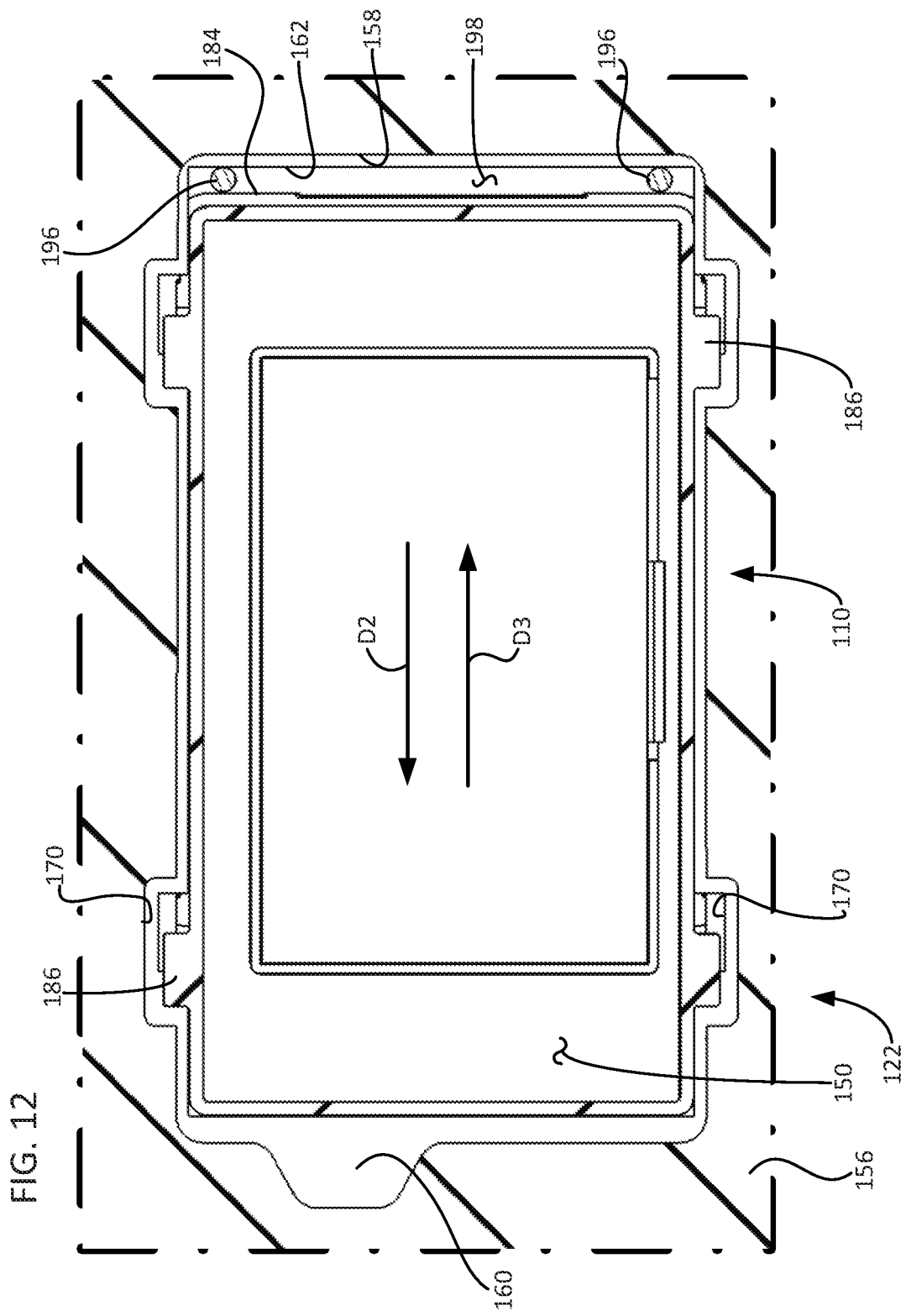
FIG. 12 is an enlarged vertical cross-section through a portion of the door assembly including the electronics module, viewed from the rear of the door assembly looking forward.

The trim piece 172 further comprises a pair of stops 196 that protrude rearwardly from spaced apart locations along one side portion of the frame 190. As shown in FIG. 12 and will be explained in further detail below, the stops 196 are configured to be received in a gap 198 between adjacent, opposing sides of the display housing 182 and the electronics module recess 150 to prevent the electronics module 110 from being removed from the recess without first removing the trim piece 172 from the electronics module.

Referring to FIGS. 4, 6, and 12, an exemplary way in which the illustrated electronics module 110 can be releasably attached to and removed from the door 124 will now be described. To attach the electronics module 110 to the door 124, the user positions the electronics module in front of the recess 150 with the display 112 facing forward. The user aligns the tabs 186 with the front openings of the receivers 170 and then moves the electronics module 110 rearward relative to the door 124 in the first direction D1 such that the tabs pass into the openings at the fronts of the L-shaped receivers. When each tab 186 has moved in the first direction D1 until it reaches the rear end portion of the respective receiver 170, the user moves the electronics module laterally of the door 124 in the second direction D2. This positions each tab 186 behind a respective portion of the veneer panel 160 (broadly, behind a portion of the door 124) and thus creates an interlock between the electronics module 110 and the door that partially retains the electronics module in the door. Moving the electronics module 110 laterally the second direction D2 also forms the lateral gap 198 between the side edge of the bezel 184 and the side edge of the electronics module recess 150. To fully secure the electronics module 110 to the door 124, the user attaches the trim piece 172 to the electronics module (e.g., by snap-fit connection) so that the trim piece stops 196 are received in the lateral gap 198. The stops 196 are thus received between the electronics module 110 and the edge of electronics module recess 150 and inhibit movement of the electronics module relative the door 124 in a third direction D3 opposite the second direction D2. The trim piece 172 thereby prevents the electronics module 110 from being removed from the door 124 without first removing the trim piece.

During use of the ice maker 10, it may be desirable to periodically remove the electronics module 110 from the door 124. For example, a user may wish to replace or repair all or some of the electronics module 110 or another component of the ice maker 10 that is accessible through the electronics module recess 150. Further, a user may wish to remove the electronics module 110 from the door 124 to access the data connector 116, for example, for connecting a data acquisition device 117 to the ice maker and downloading usage data. To remove, the electronics module 110 in the illustrated embodiment, the user first disconnects the trim piece 172 from the electronics module. Subsequently, the user moves electronics module 110 relative to the door 124 in the third direction D3 until the tabs 186 align with the front openings of the receivers 170. Finally, the user moves the electronics module 110 forward relative to the door 124 in a fourth direction D4 (FIG. 4) until the tabs 186 are released from the receivers 170. As can be seen, no tools are required to remove the electronics module 110 from the recess 150. Likewise, the user is not required to loosen any threaded fasteners to remove the electronics module 110 from the recess 150.

In one or more embodiments, after removing the detachable electronics module 110 from the door 124, the user connects the data acquisition device 117 to the data connector 116 that is exposed by the removal of the electronics module. Subsequently, the user downloads usage information from the appliance (e.g., from memory 114) to the data acquisition device 117 via the data connector 116. In certain embodiments, the user can perform one or more other maintenance or repair tasks (e.g., replacing a part, cleaning a part) in addition to or instead of downloading the usage information. After the desired tasks are completed, the user can reattach the electronics module using the same method described above. Thus, in one or more embodiments, the electronics module 110 can be repeatably attached to and removed from the door 124; and likewise in certain embodiments, the trim piece 172 can be repeatably attached to and removed from the electronics module.

In the illustrated embodiment described above, the portion of the enclosure 29 defining the electronics module recess 150 defines receivers for receiving tabs 186 of the electronics module 110 therein. In certain embodiments, other arrangements of tabs and receivers (broadly, other arrangements of complementary interlocking elements) can be used. For example, it is expressly contemplated that, in one or more embodiments, the portion of the enclosure defining the electronics module recess includes one or more tabs that are configured to be received in respective receiver(s) defined by the electronics module.

When introducing elements of the present invention or the preferred embodiment(s) thereof, the articles "a", "an", "the" and "said" are intended to mean that there are one or more of the elements. The terms "comprising", "including"

and "having" are intended to be inclusive and mean that there may be additional elements other than the listed elements.

In view of the above, it will be seen that the several objects of the invention are achieved and other advantageous results attained.

As various changes could be made in the above products and methods without departing from the scope of the invention, it is intended that all matter contained in the above description shall be interpreted as illustrative and not in a limiting sense.

What is claimed is:

1. A refrigeration appliance comprising: an enclosure configured to define an interior space, the enclosure comprising an enclosure portion that defines an electronics module recess; and a detachable electronics module comprising a display and a display housing enclosing at least a portion of the display, the electronics module configured to be removably received in the electronics module recess; a trim piece configured to releasably attach to the display housing whereby the trim piece mounts on the enclosure, the trim piece being separable from the enclosure and the electronics module; wherein one of the enclosure portion and the display housing defines at least one tab and the other of the enclosure portion and the display housing defines a receiver for each tab; wherein each tab is removably insertable into the respective receiver to releasably couple the electronics module to the enclosure in the electronics module recess; wherein the trim piece is configured to secure the electronics module in the enclosure when the trim piece is attached to the display housing such that the trim piece fixes each tab in place in the respective recess; and wherein the trim piece is configured to release the electronics module from the enclosure when the trim piece is released from the display housing such that each tab is freely movable in the respective recess; wherein the trim piece is configured to be releasably attached to the display housing by a snap-fit connection.

2. An appliance as set forth in claim 1, wherein the display housing defines each tab and the enclosure portion defines each receiver.

3. An appliance as set forth in claim 2, wherein the display housing defines at least one tab along each of a pair of opposite sides of the electronics module.

4. An appliance as set forth in claim 3, wherein the display housing defines a plurality of tabs along at least one of the pair of opposite sides of the electronics module.

5. An appliance as set forth in claim 1, wherein the electronics module is configured to be retained in the electronics module recess without any threaded fastener connecting the electronics module to the enclosure.

6. An appliance as set forth in claim 1, further comprising a memory storing information about the appliance and a data connector for connecting an external data acquisition device to the memory to download the information from the memory.

7. An appliance as set forth in claim 6, wherein the enclosure and the electronics module are configured to cover the data connector when the electronics module is received in the electronics module recess and expose the data connector when the electronics module is removed from the electronics module recess.

8. An appliance as set forth in claim 7, wherein the data connector is integral to the electronics module.

9. An appliance as set forth in claim 1, wherein the display comprises a touch screen display.

10. An appliance as set forth in claim 1, wherein said enclosure portion comprises a door and the enclosure further comprises a stationary enclosure portion, the door being movable with respect to the stationary enclosure portion to selectively provide access to the interior of the appliance.

11. An appliance as set forth in claim 1, further comprising a refrigeration system, at least a portion of the refrigeration system being received in the interior space.

12. An appliance as set forth in claim 1, wherein the refrigeration appliance comprises an ice maker, the ice maker comprising a refrigeration system comprising an ice formation device and a water system for supplying water to the ice formation device, at least a portion of each of the refrigeration system and the ice formation device being received in the interior space.

13. A refrigeration appliance comprising: an enclosure configured to define an interior space, the enclosure comprising an enclosure portion that defines an electronics module recess; and a detachable electronics module comprising a display and a display housing enclosing at least a portion of the display, the electronics module configured to be removably received in the electronics module recess; a trim piece configured to releasably attach to the display housing whereby the trim piece mounts on the enclosure, the trim piece being separable from the enclosure and the electronics module; wherein one of the enclosure portion and the display housing defines at least one tab and the other of the enclosure portion and the display housing defines a receiver for each tab; wherein each tab is removably insertable into the respective receiver to releasably couple the electronics module to the enclosure in the electronics module recess; wherein the trim piece is configured to secure the electronics module in the enclosure when the trim piece is attached to the display housing such that the trim piece fixes each tab in place in the respective recess; and wherein the trim piece is configured to release the electronics module from the enclosure when the trim piece is released from the display housing such that each tab is freely movable in the respective recess; wherein each receiver comprises a generally L-shaped slot having a first segment defining an open end of the slot and a second segment extending generally perpendicular to the first segment.

14. An appliance as set forth in claim 13, wherein each tab is configured to be inserted into the respective receiver without deformation of the tab by movement of the tab in a first direction through the open end and along the first segment of the respective slot and by movement of the tab in a second direction along the second segment of the respective slot.

15. An appliance as set forth in claim 14, wherein the trim piece is configured to be releasably attached to the display housing by a snap-fit connection.

16. A refrigeration appliance comprising:
an enclosure configured to define an interior space of the appliance, the enclosure comprising an enclosure portion that defines an electronics module recess; and
a detachable electronics module comprising a display and a display housing enclosing at least a portion of the display, the electronics module configured to be removably received in the electronics module recess;
wherein one of the enclosure portion and the display housing defines at least one tab and the other of the enclosure portion and the display housing defines a receiver for each tab;

wherein each tab is removably insertable into the respective receiver to releasably couple the electronics module to the enclosure in the electronics module recess;

wherein each receiver comprises a generally L-shaped slot having a first segment defining an open end of the slot and second segment extending generally perpendicular to the first segment;

wherein each tab is configured to be inserted into the respective receiver by movement of the tab in a first direction through the open end and along the first segment of the respective slot and by movement of the tab in a second direction along the second segment of the respective slot;

wherein the appliance further comprises a trim piece configured to be releasably attached to the display housing by a snap-fit connection;

wherein the trim piece includes a stop, wherein when the electronics module is coupled to the enclosure in the electronics module recess and the trim piece is attached to the display housing by the snap-fit connection, the stop is configured to engage at least one of the electronics module and the display housing to prevent movement of each tab along the second segment of the respective slot in a third direction opposite the second direction.

17. A refrigeration appliance comprising:

an enclosure configured to define an interior space of the appliance, the enclosure comprising an enclosure portion that defines an electronics module recess; and a detachable electronics module comprising a display and a display housing enclosing at least a portion of the display, the electronics module configured to be removably received in the electronics module recess;

a trim piece configured to be releasably attached to the display housing by a snap-fit connection whereby the trim piece mounts on the enclosure, the trim piece being separable from the enclosure and the electronics module;

wherein the trim piece is configured to retain the electronics module in the electronics module recess when the electronics module is received in the electronics module recess and the trim piece is attached to the display housing by the snap-fit connection and wherein the trim piece is configured to separate from the display housing while the electronics module remains in the electronics module recess to release the electronics module from the electronics module recess such that the display housing is freely removable from the electronics module recess when the trim piece is separated from display housing.

* * * * *